US 6,518,129 B2

(12) United States Patent
Hueting et al.

(10) Patent No.: US 6,518,129 B2
(45) Date of Patent: Feb. 11, 2003

(54) MANUFACTURE OF TRENCH-GATE SEMICONDUCTOR DEVICES

(75) Inventors: Raymond J. E. Hueting, Helmond (NL); Erwin A. Hijzen, Blanden (BE); Michael A. A. Zand In't, Veldhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/932,073

(22) Filed: Aug. 17, 2001

(65) Prior Publication Data

US 2002/0022324 A1 Feb. 21, 2002

(30) Foreign Application Priority Data

Aug. 17, 2000 (GB) ............................................. 0020126
Jan. 23, 2001 (GB) ............................................. 0101690

(51) Int. Cl.⁷ ............................................. H01L 21/336
(52) U.S. Cl. ...................... 438/270; 438/259; 438/424; 257/330
(58) Field of Search ............................... 438/270, 259, 438/424; 257/330

(56) References Cited

U.S. PATENT DOCUMENTS

| | | | |
|---|---|---|---|
| 5,177,576 A | | 5/1991 | Kimura et al. ................ 257/71 |
| 6,051,469 A | * | 4/2000 | Sheu et al. |
| 6,130,136 A | * | 10/2000 | Johnson et al. |
| 6,300,210 B1 | * | 10/2001 | Klootwijik et al. |
| 6,323,092 B1 | * | 11/2001 | Lee |
| 6,372,564 B1 | * | 4/2002 | Lee |

FOREIGN PATENT DOCUMENTS

| | | | |
|---|---|---|---|
| JP | 09134916 A | 5/1997 | ......... H01L/21/316 |
| WO | WO9954918 | 3/1999 | |
| WO | W09954918 | 10/1999 | |

OTHER PUBLICATIONS

K. Nam et al; "A Novel Simplified Process for Fabrication a Very High Density P–Channel Trench Gate Powers MOSFET", IEEE Electorn Device Letters, vol. 21, No. 7, Jul. 2000, pp. 356–367, XP 000951986.

* cited by examiner

*Primary Examiner*—Long Pham
(74) *Attorney, Agent, or Firm*—Steven R. Biren

(57) ABSTRACT

The manufacture of a trench-gate semiconductor device, for example a power transistor or a memory device includes the steps of forming at a surface (10*a*) of a semiconductor body (10) a first mask (51) having a first window (51*a*), providing a thin layer of a second material (52) in the first window (51*a*), forming an intermediate mask (53A, 53B) of a third material having curved sidewalls and using the intermediate mask (53A, 53B) to form two L-shaped parts (52A, 52D and 52B, 52E) of the second material with a second window (52*a*) which is used to etch a trench-gate trench (20). The rectangular base portion (52D, 52E) of each L-shaped part ensures that the trench (20) is maintained narrow during etching. Narrow trenches are advantageous for low specific on-resistance and low RC delay in low voltage cellular trench-gate power transistors. Narrow deep trenches are also advantageous for cell density in DRAM devices where a memory cell has a switching transistor cell surrounded by a trench-gate and a storage capacitor in a lower part of the same trench.

15 Claims, 5 Drawing Sheets

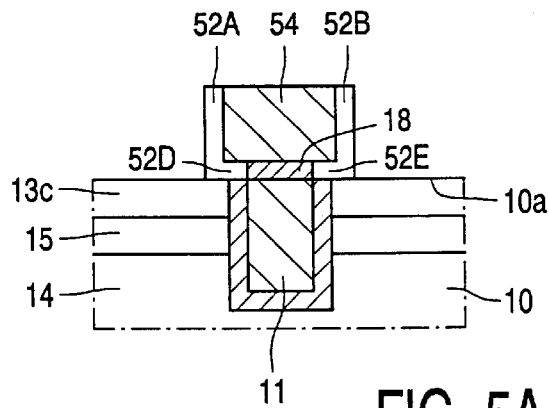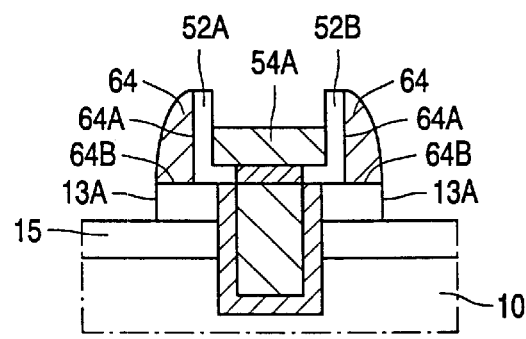
FIG. 5A  FIG. 5B
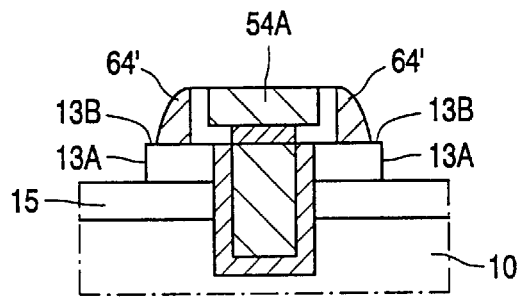
FIG. 5C
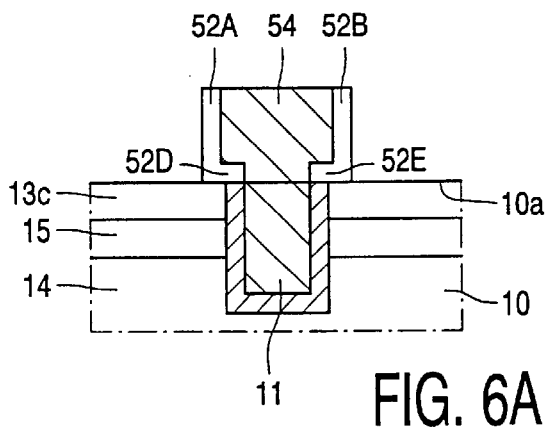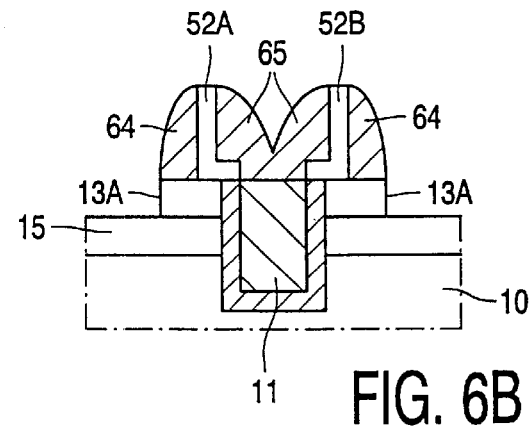
FIG. 6A  FIG. 6B
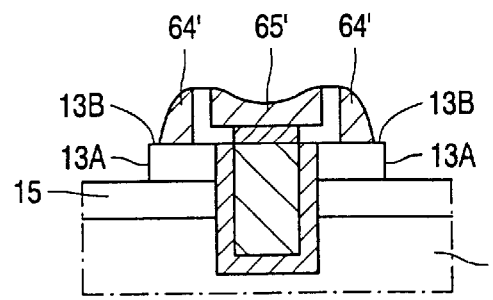
FIG. 6C

MANUFACTURE OF TRENCH-GATE SEMICONDUCTOR DEVICES This invention relates to a method of manufacturing a trench-gate semiconductor device of the type comprising a semiconductor body having a plurality of transistor cells, each transistor cell being surrounded by a trench-gate comprising a trench extending into the semiconductor body with gate material in the trench, and each transistor cell having source and drain regions which are separated by a channel-accommodating region adjacent to the trench-gate. The invention also relates to semiconductor devices of this type manufactured by such a method.

In a method of manufacturing a trench-gate semiconductor device of the above-defined type which is known from WO-A-99/54918 (our reference PHB34245), the method includes the steps of:

(a) forming at a surface of the semiconductor body a first mask of a first material having first windows, each first window having a mid-point path coincident with a mid-point path of a said trench which will be formed later;

(b) forming on the semiconductor body a second mask having second windows, each second window being formed within and smaller than a said first window by providing two sidewall extensions to the first mask in the first window; and (c) forming said trenches by etching into the semiconductor body at the second windows.

In the disclosed method of WO-A-99/54918 the above-stated steps (a), (b) and (c) are included in making the semiconductor device as a vertical power transistor by a self-alignment process which enables a reproducible transistor cell pitch of 5 μm or less. The width of the trench-gate trenches is not discussed, but in this disclosed method the two sidewall extensions to the first mask which form each second window each have a curved sidewall. During etching of the trenches the width of these sidewall extensions will reduce due to their curved sidewall surface. Thus the second windows and hence the trenches will be widened during trench etching.

An object of the present invention is to provide a method which is better adapted for producing narrow trenches in a trench-gate semiconductor device.

According to the present invention there is provided a method as defined in claim 1, that is a method including steps (a), (b) and (c) as above-defined, the method being characterised by the steps of:

(d) providing in each first window a continuous layer of a second material from which the second mask will be formed, the layer of second material having upright portions on the sidewalls of the first mask and a base portion on the surface of the semiconductor body;

(e) forming an intermediate mask of a third material in each first window covering the upright portions of the layer of second material and covering the base portion of the layer of second material except where the second window will be formed;

(f) using the intermediate mask in each first window to etch the base portion of said layer of second material and form said second window; and (g) removing the intermediate mask to leave a pair of L-shaped parts of said second material within each first window as said two sidewall extensions to the first mask, each L-shaped part having a rectangular section base portion with a top surface parallel to the semiconductor body surface and a side surface perpendicular to the semiconductor body surface, and then carrying out step (c) to form said trenches.

In the method of the present invention, the rectangular section base portion of each L-shaped part ensures that there is no appreciable widening of the second windows during trench etching. The trenches will be uniformly vertically etched and will be maintained narrow during etching in accordance with the second windows defined by the L-shaped parts.

JP-A-09134916 discloses a method of manufacturing a semiconductor device including steps similar to the above-stated known steps (a), (b) and (c) of the present invention except that the second windows are not used for etching trench-gate device trenches but are instead used for etching shallow grooves which will accommodate recessed local oxidation isolation regions. The sidewall extensions provided to the first mask for forming the second windows are disclosed in one embodiment of this document as parts having a curved sidewall and are disclosed in another embodiment as L-shaped parts. The choice between these two types of sidewall extensions which is made in the method of the present invention for the purpose of better production of narrow trench-gate device trenches is not derivable from the teachings of this document JP-A-09134916.

Preferred features of the method in accordance with the present invention, including features adapted to the method being for manufacturing the semiconductor device as a vertical power transistor and features adapted to the method being for manufacturing the semiconductor device as a memory device, are defined in claims 2 to 15. A trench-gate power transistor manufactured by the method of the invention and preferred features of such a power transistor are defined in claims 16 to 19. A memory device manufactured by the method of the invention is defined in claim 20. Advantages of the just-mentioned preferred features are discussed in relation to the embodiments described below.

Embodiments of the present invention will now be described, by way of example, with reference to the accompanying diagrammatic drawings, in which:

FIGS. 5A, 5B and 5C are cross-sectional views of part of a semiconductor body respectively showing another modification of FIG. 1J and then succeeding stages in another example of a method in accordance with the invention;

Figure 1A:
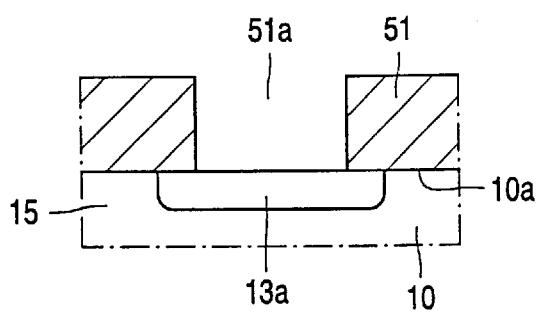
FIGS. 1A to 1J are a cross-sectional view of part of a semiconductor body at successive stages in the manufacture of a vertical trench-gate power transistor by an example of a method in accordance with the present invention, these Figures showing the manufacture of a trench-gate and showing part of a transistor cell on either side of the trench-gate.
Figure 1B:
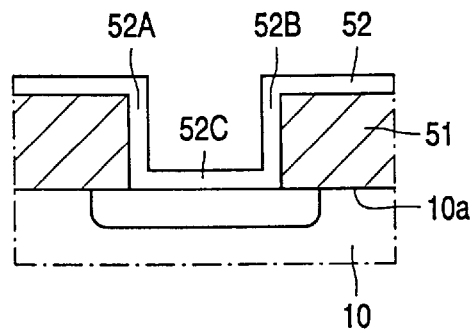
Figure 1C:
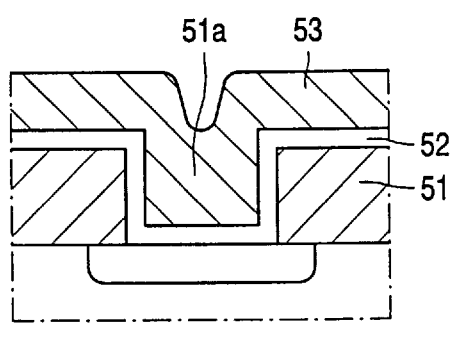
Figure 1D:
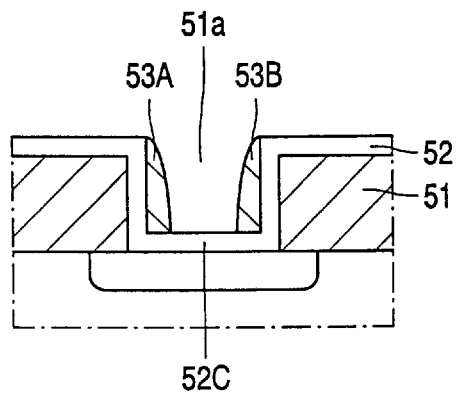
Figure 1E:
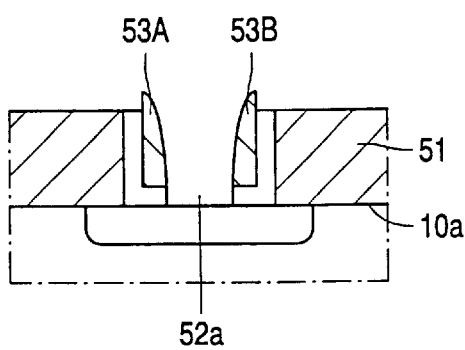
Figure 1F:
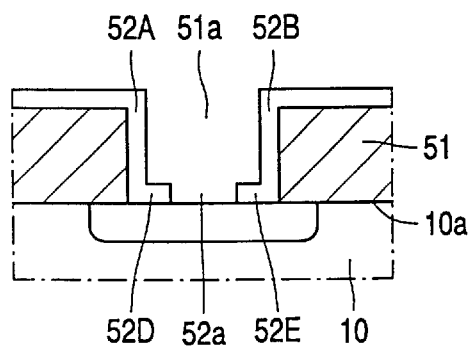
Figure 1G:
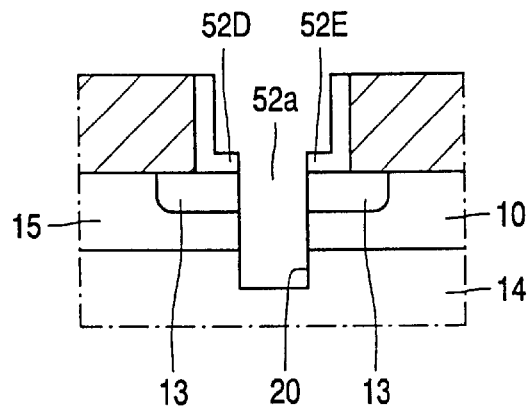
Figure 1H:
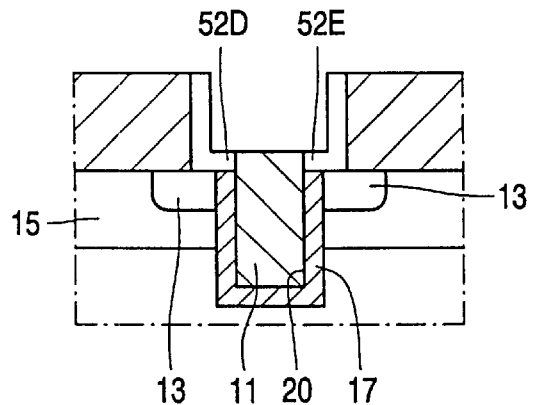
Figure 1I:
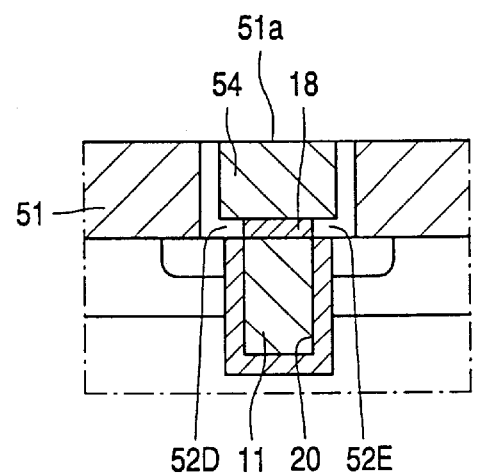
Figure 1J:
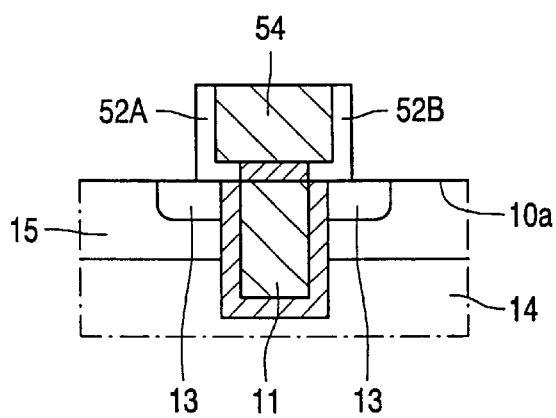
Figure 7:
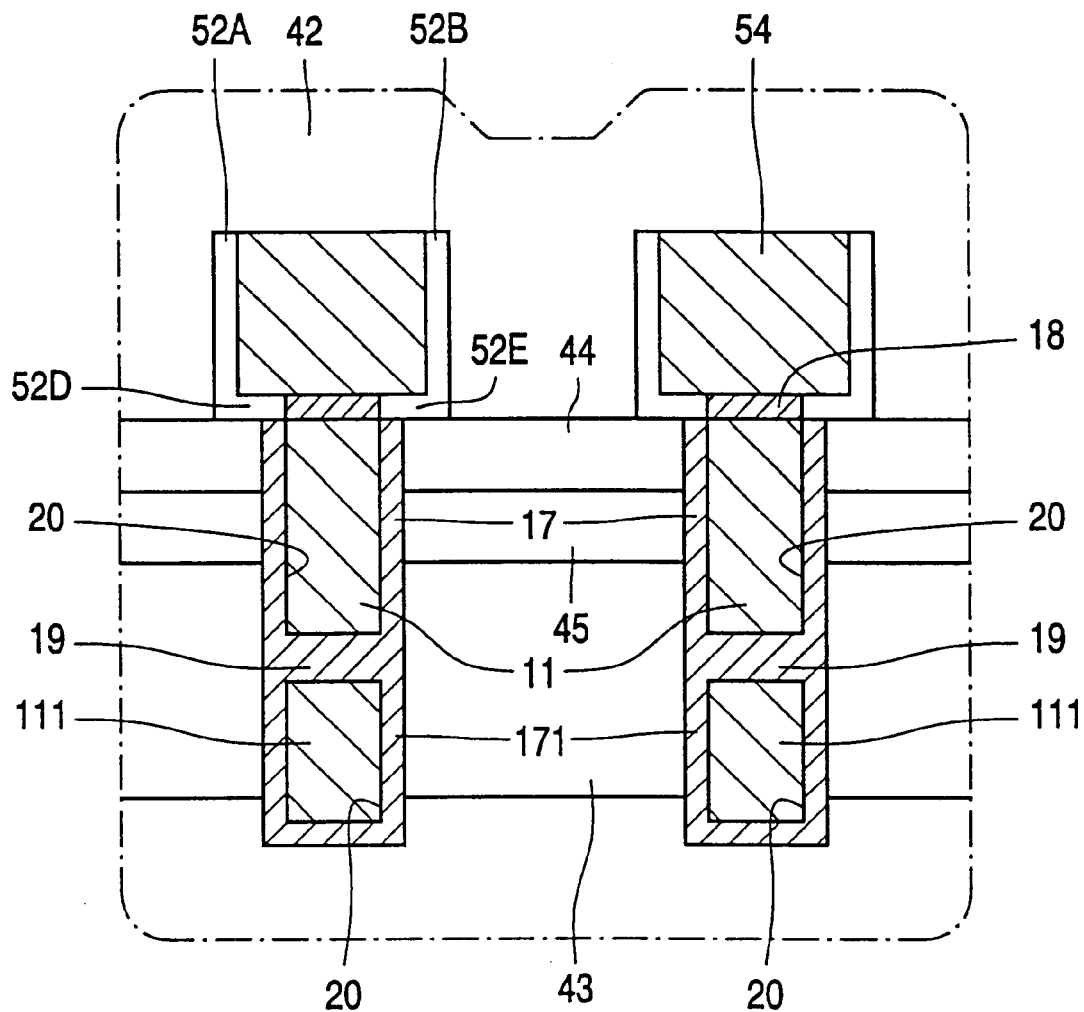

FIGS. 6A, 6B and 6C are cross-sectional views of part of a semiconductor body respectively showing another modification of FIG. 1J and then succeeding stages in another example of a method in accordance with the invention; and FIG. 7 is a cross-sectional view of a semiconductor body showing a memory cell of a trench-gate semiconductor memory device manufactured by another example of a method in accordance with the present invention.

It should be noted that all the Figures are diagrammatic and not drawn to scale. Relative dimensions and proportions of parts of the drawings have been shown exaggerated or reduced in size, for the sake of clarity and convenience in the drawings. The same reference signs are generally used to refer to corresponding or similar features in different stages of manufacture and in modified and different embodiments.

Figure 2:
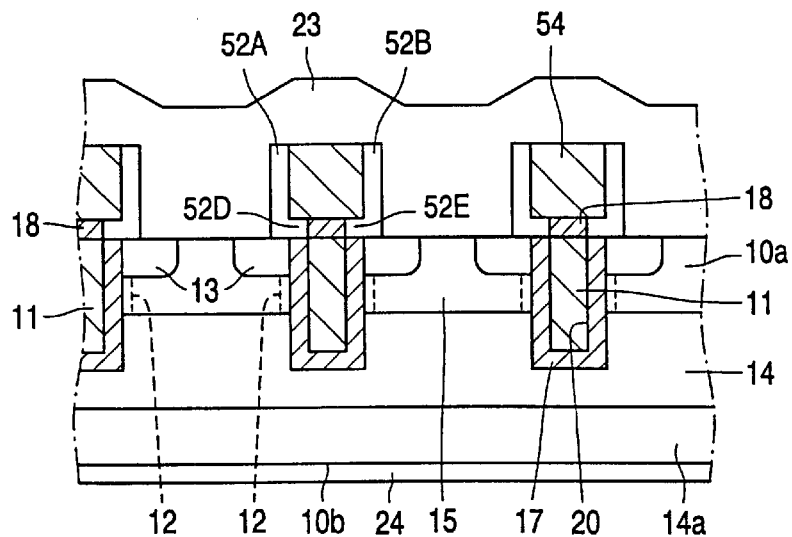
FIG. 2 is a cross-sectional view of the semiconductor body of FIG. 1J, showing two transistor cells with surrounding trench-gates and showing source and drain electrodes, the section of FIG. 2 being on the line A—A of FIG. 3.

FIG. 2 illustrates an exemplary embodiment of a vertical trench-gate power transistor having a plurality of transistor cells, each transistor cell being surrounded by a trench-gate comprising gate material 11 in a trench 20, and each transistor cell having source and drain regions 13 and 14, respectively, of a first conductivity type (n-type in this example) which are separated by a channel-accommodating region 15 of the opposite second conductivity type (i.e. p-type in this example) adjacent to the trench-gate. The application of a voltage signal to the gate 11 in the on-state of the device serves in known manner for inducing a conduction channel 12 in the region 15 and for controlling current flow in this conduction channel 12 between the source and drain regions 13 and 14.

The source region 13 is contacted by a source electrode 23 at the top major surface 10a of the device body. The region 14 may be a drain-drift region formed by an epitaxial layer of high resistivity (low doping) on a substrate region 14a of high conductivity. This substrate region 14a may be of the same conductivity type (n-type in this example) as the region 14 to provide a vertical MOSFET, or it may be of opposite conductivity type (p-type in this example) to provide a vertical IGBT. The substrate region 14a is contacted at the bottom major surface 10b of the device body by an electrode 24, called the drain electrode in the case of a MOSFET and called the anode electrode in the case of an IGBT.

The device of FIG. 2 is manufactured by a method which, in overview of FIGS. 1A to 1G, includes the steps of:

forming at a surface 10a of a semiconductor body 10 (typically of monocrystalline silicon) a first mask 51 of a first material having first windows 51a, see FIG. 1A;

providing in each first window 51a a continuous layer 52 of a second material (preferably silicon nitride) from which a second mask will be formed, the layer 52 of second material having upright portions 52A, 52B on the sidewalls of the first mask 51 and a base portion 52C on the surface 10a of the semiconductor body, see FIG. 1B;

forming an intermediate mask 53A, 53B of a third material in each first window 51a covering the upright portions 52A, 52B of the layer of second material and covering the base portion 52C of the layer of second material except where a second window will be formed, see FIGS. 1C and 1D;

using the intermediate mask 53A, 53B in each first window 51a to etch the base portion 52C of the layer of second material and form the second window 52a within and smaller than the first window 51a, see FIG. 1E;

removing the intermediate mask 53A, 53B to leave a pair of L-shaped parts 52A, 52D and 52B, 52E of the second material within each first window 51a as the second mask formed by two sidewall extensions to the first mask 51 in each first window 51a, each L-shaped part having a rectangular section base portion 52D, 52E with a top surface parallel to the semiconductor body surface 10a and a side surface perpendicular to the semiconductor body surface 10a, see FIG. 1F; and then forming trenches 20 by etching into the semiconductor body 10 at each second window 52a, see FIG. 1G.

The rectangular base portion 52D, 52E of each L-shaped part ensures that there is no appreciable widening of the second windows 52a during trench etching, and so the trenches 20 will be maintained narrow during etching in accordance with the second windows 52a. Advantages for a cellular trench-gate power transistor of this method which is well adapted for producing narrow trenches are explained in detail later with reference to FIGS. 2 and 3, and are summarised here as follows. For a given transistor cell size within each surrounding trench-gate, a narrower trench-gate allows a greater transistor cell density within a given active area of the device. For a given transistor cell pitch, narrowing the trench-gate width reduces the gate-drain capacitance and hence reduces the RC delay time to a value which is comparable with that which would otherwise be achieved with a smaller cell pitch. Also, for a given transistor cell pitch where the transistor cells are configured in a two-dimensionally repetitive pattern, for example having a square cell geometry, narrowing the trench-gate width significantly increases the perimeter of the channel-accommodating region i.e. increases the channel width and hence reduces the channel resistance. For comparatively low voltage vertical trench-gate power transistors where the channel resistance is the predominant contribution to the specific on-resistance of the device, narrowing the trench-gate width for a given transistor cell pitch significantly reduces the specific on-resistance of the device.

Successive stages in the manufacture of the transistor cells of FIG. 2 will now be described in detail with reference to FIGS. 1A to 1J.

FIG. 1A shows a monocrystalline silicon semiconductor body 10 having an upper surface 10a and an upper p-type region 15 suitable for forming the channel-accommodating regions of the transistor cells. A first mask 51 of a first material, in this example silicon dioxide, is formed at the surface 10a by forming a continuous thick layer using known deposition techniques, for example plasma enhanced chemical vapour deposition, and then forming first windows 51a in this layer using known photolithography and etching techniques. Each first window 51a has a mid-point path coincident with a mid-point path of a trench which will be formed later. In a typical example, the layer 51 has a thickness of 0.5 $\mu$m and each window has a width of 0.6 $\mu$m.

Regions 13a of n+ conductivity type suitable for the annular source regions of the transistor cells are formed in an upper part of the region 15 of the semiconductor body 10 by implantation of donor ions (for example of phosphorous or arsenic) followed by annealing and then diffusing so that each region 13a extends laterally below the mask 51 to a required distance beyond the masking edge of the window 51a.

As illustrated in FIG. 1B, a continuous thin layer 52 of a second material, in this example silicon nitride, is formed by deposition on top of the first mask 51 and in each first window 51a conformal to the shape of the window 51a. The layer 52 has upright portions 52A, 52B on the sidewalls of the first mask 51 and a base portion 52C on the surface 10a of the semiconductor body 10. In the typical example, the layer 52 has a thickness of 0.05 $\mu$m.

As illustrated in FIG. 1C, a layer 53 of a third material, in this example polycrystalline silicon (or amorphous, or polycrystalline silicon-germanium), is deposited on the layer 52 of silicon nitride on top of the first mask 51 and in the first windows 51a. In the typical example, the layer 53 may be 0.1 μm to 0.5μm thick on top of the mask 51. The layer 53 has a contoured upper surface with a dip in the region of the window 51a. The layer 53 is then anisotropically etched back to expose the layer 52 of silicon nitride on top of the first mask 51 and to leave an intermediate mask of the third material in each first window 51a as two curved sidewall parts 53A, 53B as shown in FIG. 1D. The sidewall parts 53A, 53B cover the upright portions 52A, 52B of the layer of silicon nitride and cover the base portion 52C of the layer of silicon nitride except where a second window will be formed. In the typical example the sidewall parts 53A, 53B each have a width of 0.125 μm at their base and the uncovered width of the base portion 52C is 0.25 μm.

As illustrated in FIG. 1E, the intermediate mask 53A, 53B in each first window 51a is used to etch the base portion 52C of the layer of silicon nitride and form a second window 52a. At the same time, the silicon nitride layer 52 is removed from the top of the first mask 51. As illustrated in FIG. 1F, the intermediate mask 53A, 53B is then removed by etching to leave a pair of L-shaped parts of silicon nitride within each first window 51a as two sidewall extensions to the first mask 51, each L-shaped part having an upright portion 52A, 52B and having a rectangular section base portion 52D, 52E with a top surface parallel to the semiconductor body surface 10a and a side surface perpendicular to the semiconductor body surface. The two L-shaped sidewall extensions to the first mask 51 form a second mask on the semiconductor body 10 with each second window 52a in the second mask being formed within and smaller than a first window 51a.

As illustrated in FIG. 1G a trench 20 is then formed by etching into the semiconductor body 10 at each second window 52a, preferably using an anisotropic plasma etch. The trenches 20 remove the central regions of the n+ implanted regions 13a to provide the annular source regions 13 for adjacent transistor cells; the trenches 20 extend through the p-type region 15 to form the channel-accommodating regions of adjacent transistor cells; and the trenches 20 extend into an underlying portion of the high resistivity n-type drain-drift region 14 of the transistor cells. The rectangular base portion 52D, 52E of each L-shaped silicon nitride part ensures that there is no appreciable widening of the second windows 52a during trench etching, and so the trenches 20 will be maintained narrow during etching in accordance with the second windows 52a. In the typical example the width of the trench 20 is 0.25 μm and the depth of the trench 20 is 1.0 μm.

As illustrated by FIG. 1H, a thin gate insulating layer 17 is then formed in each trench 20. This insulating layer 17 may be silicon dioxide which may be formed by deposition, or by dry oxidation of the silicon body 10, or by oxidation by wet oxide growth. If the oxide layer 17 is grown in water vapour at low temperatures it grows faster at the highly doped n+ source regions 13 than at the channel-accommodating region 15. The resulting thicker oxide 17 covering the source regions 13 is advantageous in ensuring a good quality oxide 17 under the base portions 52D, 52E of the L-shaped parts and helps to avoid a low gate oxide 17 breakdown or in the worst case a source-gate shortage. Silicon material 11, which may be doped polycrystalline silicon, is then deposited in the trench 20 on the insulating layer 17 and then etched back until it is left to provide a gate 11 for each trench-gate and also an upper part between the base portions 52D, 52E of the silicon nitride L-shaped parts.

As illustrated in FIG. 1I, the upper part of the deposited gate material 11 is then oxidised to provide a gate insulating overlayer 18 over each gate. Alternatively, the gate material 11 may first be etched back to the top of the trench 20 and then the upper part of the gate material oxidised to grow the gate insulating overlayer 18 between the base portions 52D, 52E of the silicon nitride L-shaped parts. A fourth material 54, in this example polycrystalline silicon (or amorphous, or polycrystalline silicon germanium), is then deposited and planarised so that it is provided over the gate insulating overlayer 18 and between the silicon nitride L-shaped parts within and to the top of each first window 51a.

As illustrated in FIG. 1J, the first mask 51 is then removed by etching to expose the semiconductor body surface 10a between each pair of silicon nitride L-shaped parts.

The structure as shown in FIG. 1J, including silicon nitride L-shaped parts, can be produced using combinations of first, third and fourth materials 51, 53 and 54 different to the combination given in the above-described example. Thus for example the first material 51 can be silicon dioxide as above, the third material 53 can be polycrystalline silicon (or amorphous, or polycrystalline silicon-germanium) as above, and the fourth material 54 can instead be silicon nitride. Otherwise, for example, the first material 51 can be polycrystalline silicon (or amorphous, or polycrystalline silicon-germanium), the third material 53 can be silicon dioxide, and the fourth material 54 can be silicon nitride.

Silicon nitride is preferred for the second material used to form the L-shaped parts. One reason for this is that the silicon nitride layer 52 can be highly selectively etched in the step illustrated in FIG. 1E to form the second window 52A while leaving both the intermediate mask 53A, 53B and the first mask 51 intact. A suitable wet etch for this step in the case where mask 51 is silicon oxide is a mixture of $H_3PO_4$ and $H_2SO_4$. The second material used for the layer 52 to form the L-shaped parts could alternatively be silicon dioxide. In this case, for example, the material for the first mask 51 could be silicon nitride, with the third material 53 and the fourth material 54 both being polycrystalline silicon (or amorphous, or polycrystalline silicon-germanium).

Referring now to FIG. 2, two transistor cells are shown with surrounding trench-gates 11. After forming the structure shown in FIG. 1J, two and a half such structures being shown in FIG. 2, electrode material (for example aluminium) is deposited to provide the source electrode 23. The source electrode 23 extends over the L-shaped parts 52A, 52D and 52B, 52E and over the fourth material 54 between the L-shaped parts, and the source electrode 23 contacts the annular source region 13 in each transistor cell and the channel-accommodating region 15 at the semiconductor body surface 10a within and adjacent the source region 13 in each transistor cell.

Figure 3:
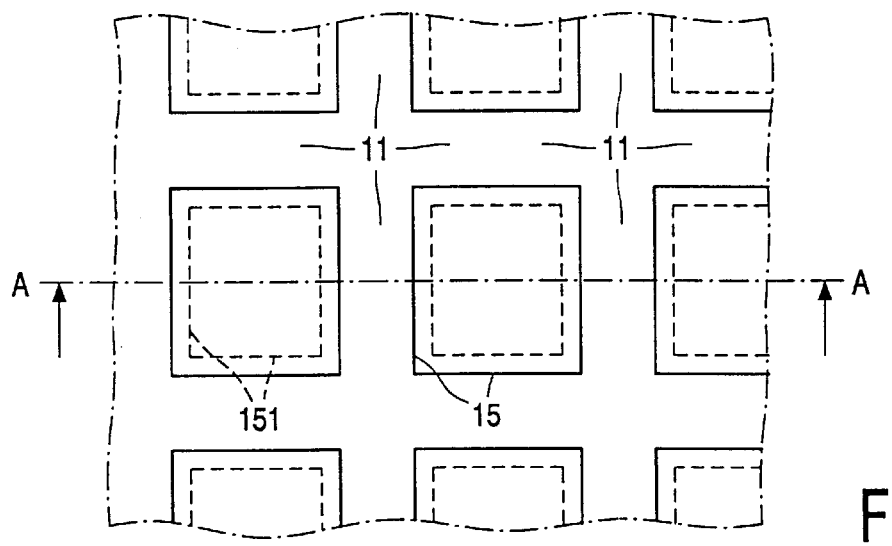
FIG. 3 is a plan view of part of the transistor cell area of the semiconductor body shown in FIG. 2, schematically illustrating square geometry transistor cells configured in a two-dimensionally repetitive pattern.

Referring now to FIG. 3, this shows a plan view of part of the semiconductor body shown in FIG. 2, schematically illustrating square geometry transistor cells configured in a two-dimensionally repetitive pattern such that the section of FIG. 2 is on the line A—A of FIG. 3. The squares shown in FIG. 3 indicate the perimeter of the channel-accommodating regions 15 of the transistor cells, each transistor cell being surrounded by a trench-gate 11. As stated above with reference to FIG. 1G, in a typical example according to the invention the width of the trenches 20 which determines the width of the trench-gates 11 is 0.25 μm. The transistor cells shown in FIGS. 2 and 3 may, in this typical example, have a cell pitch of 2 μm. The dotted outline squares 151 shown in FIG. 3 indicate the perimeter of channel-accommodating regions for transistor cells having the same cell pitch of 2 μm but with a trench-width of 0.5 μm. For comparatively low voltage vertical trench-gate power transistors, where the transistor cells are adapted to withstand a specified source-drain voltage in the off-condition and where this specified voltage is in the range up to about 50 volts, the channel resistance is the predominant contribution to the specific on-resistance of the device. As shown in FIG. 3, narrowing the trench-gate width for a given transistor cell pitch significantly increases the perimeter of the channel-accommodating region i.e. increases the channel width and hence reduces the channel resistance. We have found that in the typical example given above where the cell pitch is 2 $\mu$m, a square cell device with a trench width of 0.25 $\mu$m has a 10 percent reduced specific on-resistance compared with a device having a trench width of 0.5 $\mu$m. Furthermore, we have found that for similar devices having a cell pitch in the range 1 $\mu$m to 3 $\mu$m, trenches having a width in the range of 0.1 $\mu$m to 0.4 $\mu$m produce a reduction in specific on-resistance of up to 20% compared with devices having a trench width of 0.5 $\mu$m. The method of the present invention is well adapted to producing trenches with this indicated range of narrow widths. We envisage an aspect ratio of 4 or more for the trenches of vertical trench-gate power transistors made in accordance with this invention, which for the range of trench widths just given may correspond to trenches having a depth in the range of 0.5 $\mu$m to 3 $\mu$m.

We have found that for a given transistor cell pitch, narrowing the trench-gate width reduces the gate-drain capacitance and hence reduces the RC delay time to a value which is comparable with that which would otherwise be achieved with a smaller cell pitch. Thus trench widths in the above-stated range of 0.1 $\mu$m to 0.4 $\mu$m provide, for transistor cells having a cell pitch in the above-stated range of 1 $\mu$m to 3 $\mu$m, and RC delay time which is about the same as would otherwise only be achieved by a reduction of the cell pitch to about 0.5 $\mu$m.

FIG. 2 could be a cross-sectional view through transistor cells, each cell having an annular source region and each cell being surrounded by a trench-gate, where the transistor cells have a known cell geometry and cell layout different from that shown in FIG. 3. In one example the transistor cells may have a hexagonal shape and be configured in a close-packed two-dimensionally repetitive pattern. In this example, the above discussion of square cells regarding trench width and cell pitch and the effect with regard to specific on-resistance and RC delay time equally applies. In another example the transistor cells may have an elongate stripe shape with each stripe cell extending across the whole active area of the device and configured in a one-dimensionally repetitive pattern. In this example, where the length of each cell is very much greater than its width, narrowing the trench-gate width for a given transistor cell pitch will not significantly increase the perimeter of the channel-accommodating region of the cells and so will not reduce the specific on-resistance of the device. However, in this elongate stripe shape cell example, narrowing the trench-gate width will still reduce the gate-drain capacitance and advantageously reduce the RC delay time of the device.

A vertical trench-gate power transistor, with transistor cells which may be of square, hexagonal or elongate stripe shape geometry as described above, typically comprises many hundreds of parallel transistor cells between the source electrode 23 and the drain electrode 24. The active cellular area of the device may be bounded around the periphery of the semiconductor body 10 by various known peripheral termination schemes. With all the above-mentioned cell geometries, for a given transistor cell size within each surrounding trench-gate, a narrower trench-gate allows a greater number of transistor cells to be accommodated within a given active area of the device with a consequent reduction in the specific on-resistance of the device.

Figure 4:
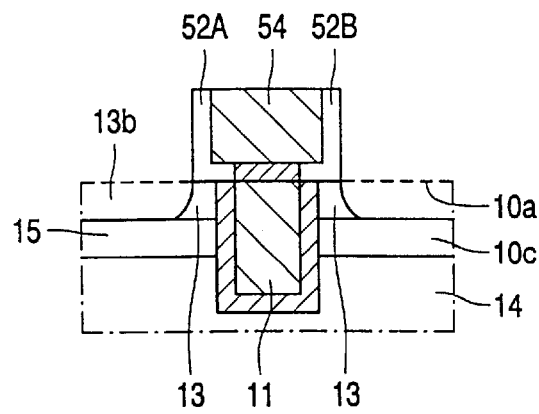
FIG. 4 is a cross-sectional view of part of a semiconductor body showing a modification of FIG. 1J in another example of a method in accordance with the invention.

Referring now to FIG. 4, this shows a modification of the structure of FIG. 1J produced by a method which varies from that described with reference to FIGS. 1A to 1J in respect of the manner of providing the transistor cell annular source regions 13. Instead of providing n+ regions 13a using the first mask 51 as shown in FIG. 1A, the semiconductor body is provided with an upper layer 13b of n+ type conductivity suitable for the annular source regions before forming the first mask 51. The layer 13b may be provided by epitaxial growth on top of the p-type conductivity region 15 or by implantation into the region 15. After removing the first mask 51 in the manner described above with reference to FIG. 1J, the upper layer 13b is etched using the L-shaped parts 52A, 52D and 52B, 52E and the fourth material 54 as an etchant mask to provide the annular source regions 13 having a lateral extent defined by the L-shaped parts. A source electrode is then provided, the source electrode extending over the L-shaped parts and over the fourth material between the L-shaped parts, and the source electrode contacting the annular source regions and the semiconductor body surface shown as 10c in FIG. 4 within the adjacent the source regions, in the same manner as has been described with reference to FIG. 2.

Referring now to FIGS. 5A, 5B and 5C, there is illustrated another modification of the method in accordance with the invention in respect of the manner of providing the transistor cell annular source regions. Instead of providing n+ regions 13a using the first mask 51 as shown in FIG. 1A for implantation into an upper p-type region 15, the stages of FIGS. 1A to 1J are performed with the semiconductor body 10 having the drain drift n-region 14 extending to the top surface 10a.

As illustrated in FIG. 5A, two stages of dopant ion implantation followed by annealing and diffusion into the semiconductor body 10 are then performed. In the first stage p-type regions 15 are formed to a suitable depth adjacent the trench-gates 20, 17, 11 suitable for the channel-accommodating body regions of the transistor cells, a suitable acceptor dopant being boron. In the second stage regions 13c of n+ conductivity type suitable for the annular source regions of the transistor cells are formed in an upper part of the semiconductor body 10, a suitable donor dopant being phosphorous or arsenic. The regions 13c are exposed between each pair of silicon nitride L-shaped parts 52A, 52D and 52B, 52E. A thin layer of silicon dioxide (not shown) may be grown on the semiconductor body surface 10a before the implantation stages, and then removed at a later stage.

A layer of silicon dioxide is then deposited and has a contoured upper surface (not shown) above the polycrystalline silicon filler 54, the silicon nitride upright portions 52A, 52B and the semiconductor body upper surface 10a. This contoured silicon dioxide layer is then anisotropically etched to form spacers 64 as shown in FIG. 5B. Each silicon dioxide spacer 64 has a vertical surface 64A aligned with an outer surface of an upright portion 52A, 52B of silicon nitride, a horizontal base surface 64B and a curved sidewall between the vertical and horizontal surfaces 64A and 64B.

As further illustrated in FIG. 5B, annular source regions 13 are then formed by etching the n+ regions 13c using the spacers 64 as a mask, the lateral extent of the source regions 13 from the trench-gates 20, 17, 11 being determined by the lateral extent of the base surface 64B of the spacers 64. Etching to form the source regions 13 exposes the vertical side surfaces 13A of these source regions 13 and the adjacent upper surfaces of the body regions 15. This etching stage also partly etches the polycrystalline filler 54 to form a reduced height filler 54A within each pair of L-shaped parts 52A, 52D and 52B, 52E.

As illustrated in FIG. 5C, the silicon dioxide spacers 64 are then etched back to form reduced spacers 64', and thus to expose top surfaces 13B of the source regions 13, and then the silicon nitride upright portions 52A, 52B are etched back to form a planarised surface with the reduced height filler 54A. A source electrode is then provided, the source electrode extending over the reduced fillers 54A, over the reduced upright portions 52A, 52B and over the reduced spacers 64', and the source electrode contacts the exposed side surface 13A and exposed top surface 13B of the annular source region 13 in each transistor cell and the channel-accommodating body region 15 within and adjacent the source region 13 in each transistor cell.

Referring now to FIGS. 6A, 6B and 6C, there is illustrated another modification of the method in accordance with the invention in respect of providing the transistor cell annular source regions. Again, instead of providing n+ regions 13a using the first mask 51 as shown in FIG. 1A for implantation into an upper p-type region 15, the stages of FIGS. 1A to 1J are performed with the semiconductor body 10 having the drain drift n-region 14 extending to the top surface 10a. FIG. 6A illustrates two stages of dopant implantation and diffusion to form p-type regions 15 and n+ conductivity type regions 13c in the same manner as described above with reference to FIG. 5A. However, the starting structure for the stages of FIG. 6A is modified with respect to that shown in FIG. 5A by modification of stages corresponding to those described above with reference to FIGS. 1H and 1I. In the stage corresponding to FIG. 1H the gate material 11 is planarised down to the level of the surface 10a of the semiconductor body 10, and in the stage corresponding to FIG. 1I the fourth material 54 is deposited to the level of the surface 10a between the base portions 52D, 52E of the L-shaped parts. Thus in the starting structure for the stage of FIG. 6A a gate insulating layer (shown as layer 18 in FIG. 5A) is not present.

Referring now to FIG. 6B, the filler 54 shown FIG. 6A is removed by etching to leave a space between the silicon nitride L-shaped parts 52A, 52D and 52B, 52E. A layer of deposited silicon dioxide will then have a contoured upper surface (not shown) above the gate material 11, the L-shaped parts 52A, 52D and 52B, 52E, and the semiconductor body upper surface 10a. Anisotropic etching of this contoured silicon dioxide layer forms the spacers 64 and at the same time forms further spacers 65 against inner surfaces of the upright portions 52A, 52B as shown in FIG. 6B, and these further spacers 65 of silicon dioxide insulating material merge and cover the silicon nitride base portions 52D, 52E and the gate material 11. When the spacers 64 are reduced after forming the source regions 13 and as shown in FIG. 6C the further spacers 65 are also reduced to leave a gate insulating overlayer 65' on top of the gate 11.

In the examples described above with reference to FIGS. 5A to 5C, and 6A to 6C, the upright portions 52A, 52B of the L-shaped parts provide well-defined steps for the spacers 64 used to form the source regions 13. Furthermore the L-shaped parts 52A, 52D and 52B, 52E play an essential part in each stage of a two-stage self-aligned process starting from a single mask 51, the first stage being to form the narrow trenches 20 using the base portions 52D, 52E and the second stage being to form the source regions using the upright portions 52A, 52B.

Possible variations and modifications of the examples described above with reference to FIGS. 5A to 5C, and 6A to 6C, are as follows. The spacers 64 have been used as a mask for etching the upper n+ regions 13c to form the source regions 13. The spacers 64 could be used differently to form the source regions. Thus, the spacers 64 could be doped material, for example polycrystalline silicon with n-type phosphorous or arsenic dopant, and the source regions 13 could be formed by diffusing this dopant from the spacers 64 into an upper p-type body region 15. Another possibility is that the spacers 64 themselves could form the source regions 13, the spacers in this case being either doped silicon or metal.

Variations and modifications of the above-described power transistors and their methods of manufacture, within the scope of the present invention, include the following.

Instead of n-type conductivity source and drain regions separated by a p-type conductivity channel-accommodating region, the source and drain regions may be p-type with the channel-accommodating region being n-type.

Instead of the channel-accommodating region being of the opposite conductivity type to the source and drain regions in the usual type of device, the channel-accommodating region may be of the same conductivity type as the source and drain regions in an accumulation-mode device in which the conductive channel induced by the trench-gate in the on-state is formed by charge-carrier accumulation. At least some of the transistor cells may have a localised region of opposite conductivity type to the source and drain regions, the localised region extending into the semiconductor body to the drain region and being separated from the trench-gate by the channel-accommodating region. In the usual type of device, the localised regions protect the cells against turning on of their in-built parasitic bipolar transistors.

Instead of the conductive trench gate being capacitively coupled to the channel-accommodating region in each cell by the gate insulating layer in the trench, so-called Schottky gate technologies may alternatively be used in which the gate insulating layer is absent and the trench-gate is of a metal that forms a Schottky barrier with the channel-accommodating region. FIGS. 1 to 6 illustrate the manufacture of insulated-gate power transistors in which the same thickness of insulator is depicted in the bottom part of the trench 20 (where it insulates the gate 11 from the drain drift region 14) and at the side walls of the trench 20 (where it forms the gate dielectric). However, in various known ways, the insulator provided at the bottom part of the trench can be thicker than the gate dielectric. Advantages in adopting such a thicker bottom insulator with a trench-gate power transistor are known (for example, in reducing gate-drain capacitance), particularly but not exclusively in power transistor structures in which the insulated gate trench 20 extends into the highly doped drain region 14a. Such a modification can be made in a manufacturing process and device in accordance with the present invention.

Referring now to FIG. 7, there is shown a different use of the invention. FIG. 7 is a cross-sectional view of a semiconductor body incorporating a memory cell which is one of a plurality of such memory cells in a dynamic random access memory device. The memory cell comprises a transistor cell surrounded by a trench-gate as a switching transistor, and a trench storage capacitor. The trench-gate comprises a trench 20 extending into the semiconductor body with gate material 11 in the trench 20. The switching transistor cell has an n-type drain region 44 and an n-type source region 43 which are separated by a p-type channel-accommodating region 45 adjacent to the trench-gate 11. The trench-gate 11 forms a memory word line, and an electrode 42 which contacts the transistor drain 44 at the top surface of the semiconductor body forms a memory bit line.

The trench 20 of this memory cell is provided by etching through a window in a mask formed by two L-shaped parts 52A, 52D and 52B, 52E which are arrived at by the same method as described above with reference to FIGS. 1A to 1G. The trench 20 may typically have a depth of about 3 μm. An insulating layer in the trench 20 provides a gate insulating layer 17 for the trench-gate switching transistor and a capacitor dielectric 171 for the trench storage capacitor.

A capacitor electrode 111, which may be doped polycrystalline silicon, is provided for the storage capacitor in a lower portion of the trench 20. A capacitor insulating layer 19, which may be formed by a vertical LOCOS process, is then provided in the trench 20 over the capacitor electrode 111. The gate material 11 for the switching transistor trench-gate is then provided in an upper portion of the trench 20 above the capacitor insulating layer 19.

The gate insulating overlayer 18 and the material 54 between the L-shaped parts are then provided and the top surface of the drain region 44 is exposed by the same method steps as described above with reference to FIGS. 1H to 1K, and the bit line electrode 42 is then deposited to contact the transistor drain region 44. The method of the invention is advantageous in providing trenches which are deep for accommodating the storage capacitors and trenches which are narrow for good cell density.

What is claimed is:

1. A method of manufacturing a trench-gate semiconductor device comprising a semiconductor body having a plurality of transistor cells, each transistor cell being surrounded by a trench-gate comprising a trench extending into the semiconductor body with gate material in the trench, and each transistor cell having source and drain regions which are separated by a channel-accommodating region adjacent to the trench-gate, wherein the method includes the steps of:

(a) forming at a surface of the semiconductor body a first mask of a first material having first windows, each first window having a mid-point path coincident with a mid-point path of said trench which will be formed later;

(b) forming on the semiconductor body a second mask having second windows, each second window being formed within and smaller than a said first window by providing two sidewall extensions to the first mask in the first window; and (c) forming said trenches by etching into the semiconductor body at the second windows;

the method being characterised by the steps of:

(d) providing in each first window a continuous layer of a second material from which the second mask will be formed, the layer of second material having upright portions on the sidewalls of the first mask and a base portion on the surface of the semiconductor body;

(e) forming an intermediate mask of a third material in each first window covering the upright portions of the layer of second material and covering the base portion of the layer of second material except where the second window will be formed;

(f) using the intermediate mask in each first window to etch the base portion of said layer of second material and form said second window; and (g) removing the intermediate mask to leave a pair of L-shaped parts of said second material within each first window as said two sidewall extensions to the first mask, each L-shaped part having a rectangular section base portion with a top surface parallel to the semiconductor body surface and a side surface perpendicular to the semiconductor body surface, and then carrying out step (c) to form said trenches.

2. A method as claimed in claim 1, wherein in step (d) the continuous layer of second material is also provided on top of the first mask, wherein in step (e) the third material is first deposited on the layer of second material on top of the first mask and in the first windows, and then the deposited third material is etched back to expose the layer of second material on top of the first mask and to leave the intermediate mask as two curved sidewall parts in each first window, and wherein in step (f) the layer of second material is also removed from the top of the first mask.

3. A method as claimed in claim 1, wherein the method further includes providing an insulating layer (17) in each trench, depositing said gate material (11) in each trench (20) on said insulating layer (17) to form a gate for each (11) trench-gate, and providing a gate insulating overlayer (18) over each said gate (11).

4. A method as claimed in claim 1, wherein the semiconductor body (10) is monocrystalline silicon, the first material (51) is silicon dioxide, and the second material (52) is silicon nitride.

5. A method as claimed in claim 1, wherein the method includes the further steps of:

(h) providing a fourth material (54) between the L-shaped parts (52A, 52D and 52B, 52E) within each said first window (51a) to the top of the first window; and (i) removing the first mask (51) to expose the semiconductor body surface (10a) between each pair of L-shaped parts.

6. A method as claimed in claim 1, wherein the semiconductor device is a vertical power transistor and wherein each transistor cell has an annular source region (13) adjacent to a top part of the trench-gate (11).

7. A method as claimed in claim 6, wherein regions (13a) of conductivity type suitable for the annular source regions are formed in an upper part of the semiconductor body (10) by dopant implantation through said first windows (51a) before step (d), wherein forming the trenches (20) in step (c) removes central portions of the implanted regions (13a) to provide the annular source regions (13), and wherein a source electrode (23) is provided after step (i), the source electrode (23) extending over the L-shaped parts (52A, 52D and 52B, 52E) and over the fourth material (54) between the L-shaped parts, and the source electrode (23) contacting the annular source regions (13) and the semiconductor body surface (10a) within and adjacent the source regions (13).

8. A method as claimed in claim 6, wherein the semiconductor body (10) is provided with an upper layer (13b) of conductivity type suitable for the annular source regions (13) before forming the first mask (51) in step (a), wherein said upper layer (13b) of the semiconductor body is etched after step (i) using the L-shaped parts (52A, 52D and 52B, 52E) and the fourth material as an etchart mask to provide the annular source regions (13) having a lateral extent defined by the L-shaped parts, and wherein after providing the annular source regions (13) a source electrode (23) is provided, the source electrode (23) extending over the L-shaped parts and over the fourth material between the L-shaped parts, and the source electrode (23) contacting the annular source regions (13) and the semiconductor body surface (10c) within and adjacent the source regions (13).

9. A method as claimed in claim 6, wherein spacers (64) are formed after step (i) with each spacer (64) having a vertical surface (64A) aligned with an outer surface of a said upright portion (52A, 52B) of second material and a horizontal base surface (64B) on the semiconductor body surface (10a), wherein the spacers (64) are used to form the annular source regions (13) with the lateral extent of the source regions (13) from the trench-gates (11) being determined by the lateral extent of the base surface (64B) of the spacers (64), and wherein a source electrode (23) is provided to contact the annular source regions (13) and the semiconductor body (15) surface within and adjacent to the source regions (13).

10. A method as claimed in claim 9, wherein regions of one conductivity type suitable for the annular source regions are present in upper parts of the semiconductor body and exposed between each pair of L-shaped parts after step (i) and before forming the spacers, and wherein the annular source regions are formed by etching the regions of one conductivity using the spacers as a mask.

11. A method as claimed in claim 10, wherein said etching to form the source regions exposes side surfaces of the source regions, and wherein the spacers are then etched to expose top surfaces of the source regions, whereby the source electrode contacts the source region side surfaces and the source region exposed top surfaces.

12. A method as claimed in claim 10, wherein the regions (13c) of one conductivity type are formed by dopant implantation and diffusion after removing the first mask.

13. A method as claimed in claim 10, wherein a gate insulating overlayer (18) is provided over the gate material (11) of each trench-gate (11) before providing the fourth material (54) between the L-shaped parts (52A, 52D and 52B, 52E) in step (h), and wherein said fourth material (54) is present when said spacers (64) are formed and when the annular source regions (13) are formed by etching.

14. A method as claimed in claim 11, wherein the fourth material (54) between the L-shaped parts (52A, 52D and 52B, 52E) is removed after step (i) and before forming the spacers (64), wherein the spacers (64) are of insulating material, and wherein, at the same time as the spacers (64) are formed with each said spacer vertical surface (64A) aligned with an outer surface of a said upright portion (52A, 52B) of second material, further spacers (65) are formed against inner surfaces of the upright portions (52A, 52B) and these further spacers merge to provide a gate insulating overlayer (65').

15. A method as claimed in claim 1, wherein the semiconductor device is a memory device having a plurality of memory cells, each memory cell comprising a said transistor cell as a switching transistor and comprising a trench storage capacitor (111, 171), wherein the method includes providing a capacitor electrode (111) for a said storage capacitor in a lower portion of each trench (20), providing a capacitor insulating layer (19) in each trench (20) over said capacitor electrode (111), and providing said gate material (11) for a said switching transistor trench-gate (11) in an upper portion of each trench (20) above the capacitor insulating layer (19).

* * * * *